(12) United States Patent
Ishimura et al.

(10) Patent No.: US 10,475,688 B2
(45) Date of Patent: Nov. 12, 2019

(54) ELECTROSTATIC CHUCK DEVICE, AND SEMICONDUCTOR MANUFACTURING DEVICE

(71) Applicant: SUMITOMO OSAKA CEMENT CO., LTD., Tokyo (JP)

(72) Inventors: Kazunori Ishimura, Tokyo (JP); Kazuto Ando, Tokyo (JP); Kentaro Takahashi, Tokyo (JP); Yuhki Kinpara, Tokyo (JP); Shinichi Maeta, Tokyo (JP); Mamoru Kosakai, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 260 days.

(21) Appl. No.: 15/550,205

(22) PCT Filed: Feb. 3, 2016

(86) PCT No.: PCT/JP2016/053263
§ 371 (c)(1),
(2) Date: Aug. 10, 2017

(87) PCT Pub. No.: WO2016/132909
PCT Pub. Date: Aug. 25, 2016

(65) Prior Publication Data
US 2018/0025933 A1    Jan. 25, 2018

(30) Foreign Application Priority Data

Feb. 18, 2015   (JP) .................................. 2015-029274
Mar. 6, 2015    (JP) .................................. 2015-044587

(51) Int. Cl.
*H01L 21/683*  (2006.01)
*H01L 21/67*   (2006.01)
*H01L 21/687*  (2006.01)

(52) U.S. Cl.
CPC .... *H01L 21/6833* (2013.01); *H01L 21/67103* (2013.01); *H01L 21/67109* (2013.01); *H01L 21/6831* (2013.01); *H01L 21/68757* (2013.01)

(58) Field of Classification Search
CPC .............................. B25B 11/00; B25B 11/005
See application file for complete search history.

(56) References Cited

U.S. PATENT DOCUMENTS

2013/0308244 A1   11/2013  Shiraiwa et al.
2014/0376148 A1   12/2014  Sasaki et al.
(Continued)

FOREIGN PATENT DOCUMENTS

JP    3182120 U       2/2013
JP    2013243267 A   12/2013
(Continued)

OTHER PUBLICATIONS

Japanese Information Offer Form, Japanese Patent Office, Application No. JP2016-510531, dated Aug. 19, 2019.

*Primary Examiner* — Lee D Wilson
(74) *Attorney, Agent, or Firm* — Greenblum & Bernstein, P.L.C.

(57) ABSTRACT

An electrostatic chuck part of an electrostatic chuck device has an electrostatic chuck part inner peripheral surface surrounding an opening of a chuck part through-hole, and an electrostatic chuck part outer peripheral surface surrounding the electrostatic chuck part inner peripheral surface. An insulator has an insulator main body in which an insulator through-hole having an opening on the electrostatic chuck part side is formed, an insulator inner end face, and an insulator outer end face which faces the electrostatic chuck part outer peripheral surface. The insulator inner end face and the electrostatic chuck part inner peripheral surface are in contact with each other, or an adhesion layer or a plasma-resistant adhesive layer extends in a gap between the (Continued)

insulator inner end face and the electrostatic chuck part inner peripheral surface. The plasma-resistant adhesive layer is formed between the electrostatic chuck part outer peripheral surface and the insulator outer end face.

10 Claims, 10 Drawing Sheets

(56) References Cited

U.S. PATENT DOCUMENTS

| | | | | |
|---|---|---|---|---|
| 2015/0145174 A1* | 5/2015 | Comb | ................... | G03G 15/224 |
| | | | | 264/464 |
| 2015/0235865 A1* | 8/2015 | Wang | .................... | H01L 21/324 |
| | | | | 438/704 |
| 2017/0133234 A1* | 5/2017 | Doba | ................. | H01J 37/32091 |
| 2018/0025933 A1* | 1/2018 | Ishimura | ........... | H01L 21/67103 |
| | | | | 269/8 |
| 2018/0108555 A1* | 4/2018 | Kosakai | .............. | H01L 21/6833 |

FOREIGN PATENT DOCUMENTS

| | | |
|---|---|---|
| JP | 2014-209615 | 11/2014 |
| WO | 2013/118781 | 8/2013 |
| WO | 2014/157571 | 10/2014 |

* cited by examiner

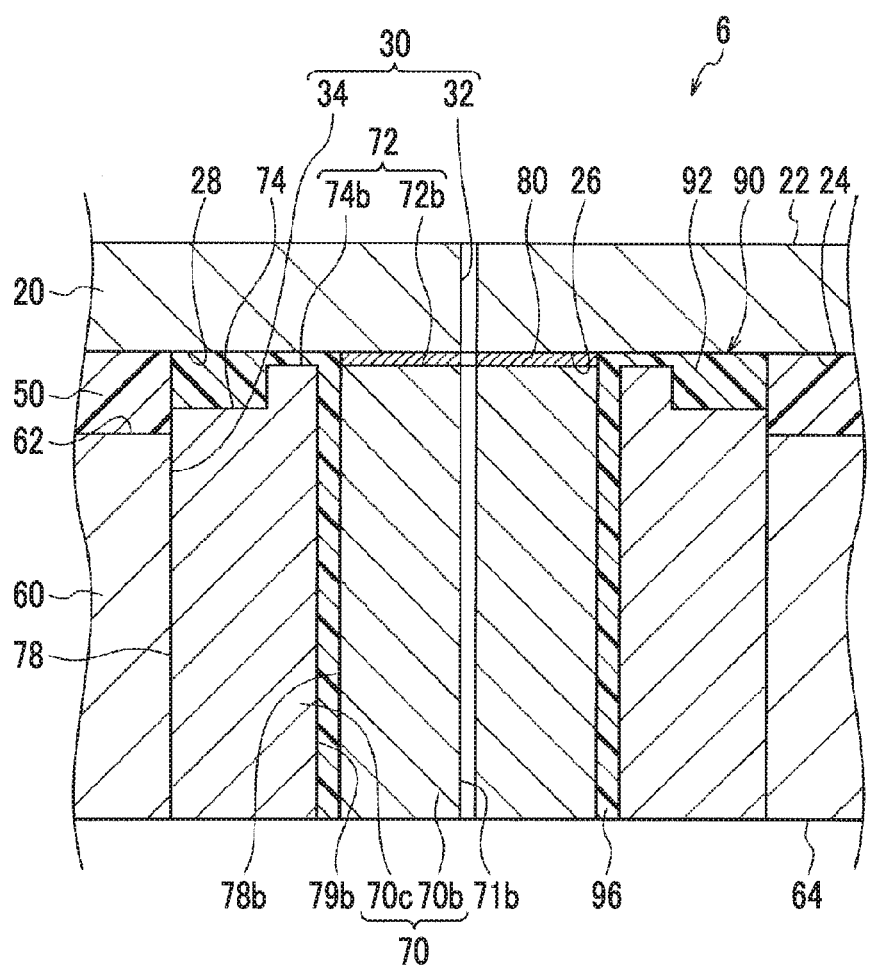

ELECTROSTATIC CHUCK DEVICE, AND SEMICONDUCTOR MANUFACTURING DEVICE

TECHNICAL FIELD

The present invention relates to an electrostatic chuck device and a semiconductor manufacturing device.

BACKGROUND ART

Patent Literature No. 1 discloses that a semiconductor manufacturing device using plasma, such as a plasma etching device or a plasma CVD device is provided with an electrostatic chuck device for fixing a plate-shaped sample such as a wafer, and a plasma irradiation mechanism for irradiating the fixed plate-shaped sample with plasma.

In the electrostatic chuck device, an adhesion layer is formed between an electrostatic chuck part having a placing surface on which a plate-shaped sample is placed and a cooling base part for cooling the electrostatic chuck part such that the electrostatic chuck part and the cooling base part are bonded together. Further, the electrostatic chuck device has a plurality of through-holes penetrating the electrostatic chuck part, the adhesion layer, and the cooling base part.

Further, there is a case of operating the plasma irradiation mechanism in a state where the plate-shaped sample is not placed on the electrostatic chuck part, and even in such a case, there is a case where plasma (radicals) from the plasma irradiation mechanism infiltrates into the through-holes.

The adhesion layer between the electrostatic chuck part and the cooling base part in the through-hole is exposed to the plasma infiltrated into the through-hole, and thus the compositional components of the adhesion layer are subjected to damage or the like. Therefore, there is a concern that consumption of the adhesion layer or deterioration of a bonding high degree may occur. If the adhesion layer deteriorates, it becomes difficult to uniformly control the heat transfer coefficient between the electrostatic chuck part and the cooling base part. Further, there is a case where dielectric breakdown occurs due to conduction between the plasma and the cooling base part.

Patent Literature No. 1 discloses, as a method of preventing such deterioration, a technique of preventing direct exposure of an adhesion layer between an electrostatic chuck part and a cooling base part by disposing a tubular sleeve in a through-hole.

However, in order to manufacture a high-quality plate-shaped sample, an electrostatic chuck device is required in which it is possible to more uniformly control the heat transfer coefficient between an electrostatic chuck part and an cooling base part.

CITATION LIST

Patent Literature

[Patent Literature No. 1] Pamphlet of International Publication No. WO2013/118781

SUMMARY OF INVENTION

Technical Problem

The present invention has been made in view of the above circumstances and has an object to provide an electrostatic chuck device and a semiconductor manufacturing device, in which it is difficult for conduction between plasma and a cooling base part to occur and it is possible to more uniformly control the heat transfer coefficient between an electrostatic chuck part and the cooling base part.

Solution to Problem

As a result of intensive studies to solve the above problems, the present invention has completed the following invention.

An electrostatic chuck device according to a first aspect of the present invention includes: an electrostatic chuck part having a placing surface on which a plate-shaped sample is plated; a cooling base part which cools the electrostatic chuck part; an adhesion layer formed between the electrostatic chuck part and the cooling base part so as to bond the electrostatic chuck part and the cooling base part together; a through-hole having a chuck part through-hole penetrating the electrostatic chuck part, and a base part through-hole penetrating the cooling base part so as to communicate with the chuck part through-hole and having a larger diameter than the chuck part through-hole; and an insulator provided in the base part through-hole.

The electrostatic chuck part has an electrostatic chuck part inner peripheral surface surrounding an opening of the chuck part through-hole on the cooling base part side of the electrostatic chuck part, and an electrostatic chuck part outer peripheral surface surrounding the electrostatic chuck part inner peripheral surface on the cooling base part side of the electrostatic chuck part. A cooling base recess portion is formed on the electrostatic chuck part side of the base part through-hole of the cooling base part. The insulator has an inner insulator in which an insulator through-hole having an opening on the electrostatic chuck part side is formed, and an outer insulator surrounding the inner insulator. In order to prevent infiltration of plasma entering through the through-hole, the inner insulator and the electrostatic chuck part inner peripheral surface are in contact with each other, or the adhesion layer extends in a gap between the inner insulator and the electrostatic chuck part inner peripheral surface, and the insulator has an insulator inner end face formed on the electrostatic chuck part side of the insulator, and an insulator outer end face formed on the electrostatic chuck part side of the insulator so as to face the electrostatic chuck part outer peripheral surface. The side opposite to the electrostatic chuck part of the outer insulator is located in the cooling base recess portion.

It is preferable that the electrostatic chuck device according to the first aspect further includes a plasma-resistant adhesive layer disposed between the electrostatic chuck part outer peripheral surface and the insulator outer end face.

An electrostatic chuck device according to a second aspect of the present invention includes: an electrostatic chuck part having a placing surface on which a plate-shaped sample is plated; a cooling base part which cools the electrostatic chuck part; an adhesion layer formed between the electrostatic chuck part and the cooling base part so as to bond the electrostatic chuck part and the cooling base part together; a through-hole having a chuck part through-hole penetrating the electrostatic chuck part, and a base part through-hole penetrating the cooling base part so as to communicate with the chuck part through-hole and having a larger diameter than the chuck part through-hole; an insulator provided in the base part through-hole; and a plasma-resistant adhesive layer disposed between the insulator and the electrostatic chuck part. The electrostatic chuck part has an electrostatic chuck part inner peripheral surface surrounding an opening of the chuck part through-hole on the cooling base part side of the electrostatic chuck part, and an electrostatic chuck part outer peripheral surface surrounding the electrostatic chuck part inner peripheral surface on the cooling base part side of the electrostatic chuck part. The insulator has an insulator main body in which an insulator through-hole having an opening on the electrostatic chuck part side is formed, an insulator inner end face formed on the electrostatic chuck part side of the insulator main body, and an insulator outer end face formed on the electrostatic chuck part side of the insulator main body so as to face the electrostatic chuck part outer peripheral surface. In order to prevent infiltration of plasma entering through the through-hole, the insulator inner end face and the electrostatic chuck part inner peripheral surface are in contact with each other, or the adhesion layer or the plasma-resistant adhesive layer extends in a gap between the insulator inner end face and the electrostatic chuck part inner peripheral surface. The plasma-resistant adhesive layer is formed between the electrostatic chuck part outer peripheral surface and the insulator outer end face.

The plasma-resistant adhesive layer may extend from an area between the electrostatic chuck part outer peripheral surface and the insulator outer end face to an area between an outer peripheral side surface of the insulator and the cooling base part.

An electrostatic chuck part recess portion may be formed in the electrostatic chuck part on the cooling base part side, and the electrostatic chuck part inner peripheral surface and the electrostatic chuck part outer peripheral surface may serve as a bottom surface of the electrostatic chuck part recess portion.

An electrostatic chuck part recess portion may be formed in the electrostatic chuck part on the cooling base part side, the electrostatic chuck part inner peripheral surface may serve as a bottom surface of the electrostatic chuck part recess portion, and the electrostatic chuck part outer peripheral surface may serve as a periphery of an opening of the electrostatic chuck part recess portion.

The cooling base part may have a cooling base recess portion on the electrostatic chuck part side, an insulator recess portion is formed in an insulator end portion on the side opposite to the electrostatic chuck part of the insulator, the side opposite to the electrostatic chuck part of the insulator may be located in the cooling base recess portion, the electrostatic chuck device may further include a lower insulator disposed on the side opposite to the electrostatic chuck part of the insulator, and a lower plasma-resistant adhesive layer formed between the insulator and the lower insulator, the lower insulator may have a lower insulator main body having a lower insulator through-hole which communicates with the insulator through-hole and surrounds an opening of the insulator through-hole, a lower insulator inner end face formed on the electrostatic chuck part side of the lower insulator main body so as to come into contact with a bottom surface of the insulator recess portion, and a lower insulator outer end face formed on the electrostatic chuck part side of the lower insulator main body so as to face an end face of the insulator end portion, and the lower plasma-resistant adhesive layer may be formed between the end face of the insulator end portion and the lower insulator outer end face.

The insulator may have an inner insulator having the insulator through-hole formed therein, and an outer insulator which surrounds the inner insulator, the insulator inner end face may be formed by an end face on the electrostatic chuck part side of the inner insulator, and an end face on the electrostatic chuck part side of the outer insulator, and the plasma-resistant adhesive layer may extend from an area between the electrostatic chuck part outer peripheral surface and the insulator outer end face to an area between the inner insulator and the outer insulator via the end face on the electrostatic chuck part side of the outer insulator.

A semiconductor manufacturing device including: the electrostatic chuck device according to the first aspect or the electrostatic chuck device according to the second aspect.

Advantageous Effects of Invention

According to the present invention, in order to prevent infiltration of plasma entering through the through-hole, the inner insulator and the electrostatic chuck part inner peripheral surface are in contact with each other, or the adhesion layer extends in a gap between the inner insulator and the electrostatic chuck part inner peripheral surface, and the insulator has an insulator inner end face formed on the electrostatic chuck part side of the insulator main body, and an insulator outer end face formed on the electrostatic chuck part side of the insulator main body so as to face the electrostatic chuck part outer peripheral surface. For this reason, deterioration of the adhesion layer due to plasma can be suppressed, and therefore, it is possible to provide an electrostatic chuck device and a semiconductor manufacturing device, in which it is possible to more uniformly control the heat transfer coefficient between an electrostatic chuck part and a cooling base part.

Further, according to the present invention, in order to prevent infiltration of plasma entering through the through-hole, particularly, the electrostatic chuck part through-hole, the insulator inner end face and the electrostatic chuck part inner peripheral surface are in contact with each other, or the adhesion layer or the plasma-resistant adhesive layer extends in a gap between the insulator inner end face and the electrostatic chuck part inner peripheral surface, and the plasma-resistant adhesive layer is formed between the electrostatic chuck part outer peripheral surface and the insulator outer end face. Therefore, plasma infiltrating through the through-hole is first prevented from infiltrating at a narrow gap between the insulator inner end face and the electrostatic chuck part inner peripheral surface, and subsequently prevented at the plasma-resistant adhesive layer formed between the electrostatic chuck part outer peripheral surface and the insulator outer end face. For this reason, deterioration of the adhesion layer due to plasma can be suppressed, and therefore, it is possible to provide an electrostatic chuck device and a semiconductor manufacturing device, in which it is possible to more uniformly control the heat transfer coefficient between an electrostatic chuck part and a cooling base part and it is possible to prevent dielectric breakdown due to short-circuit between plasma and the cooling base part.

BRIEF DESCRIPTION OF DRAWINGS

FIG. 10 is a partial cross-sectional view of an electrostatic chuck device according to an eighth embodiment of the present invention.

DESCRIPTION OF EMBODIMENTS

Figure 1:
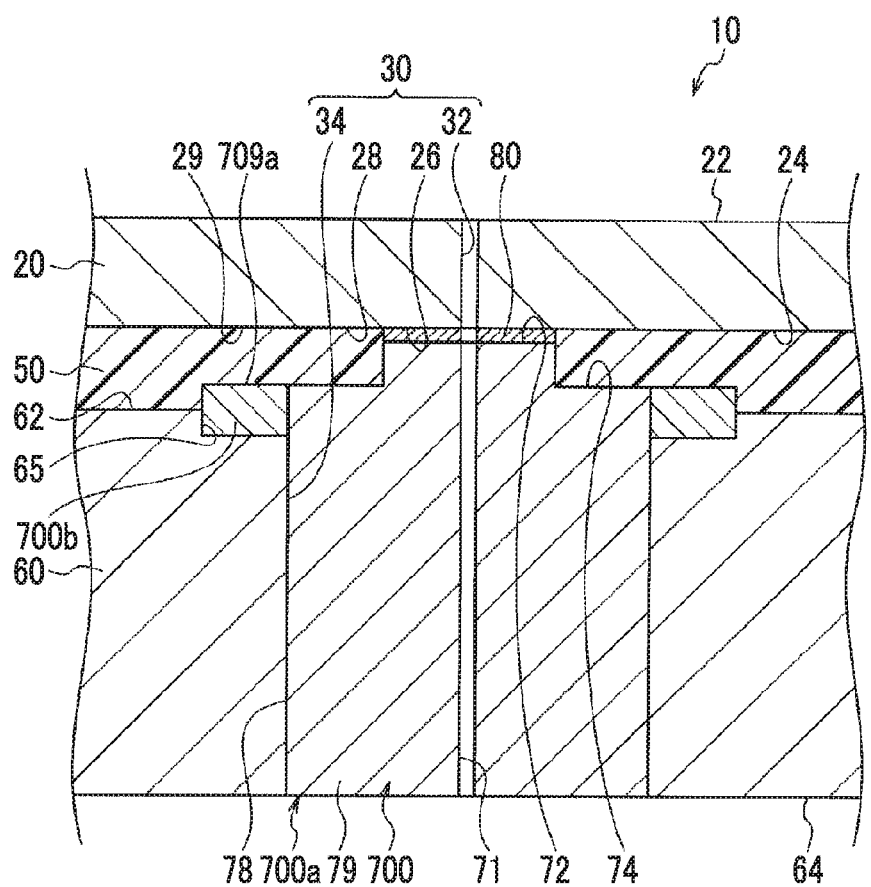
FIG. 1 is a partial cross-sectional view of an electrostatic chuck device according to a first embodiment of the present invention.
Figure 2:
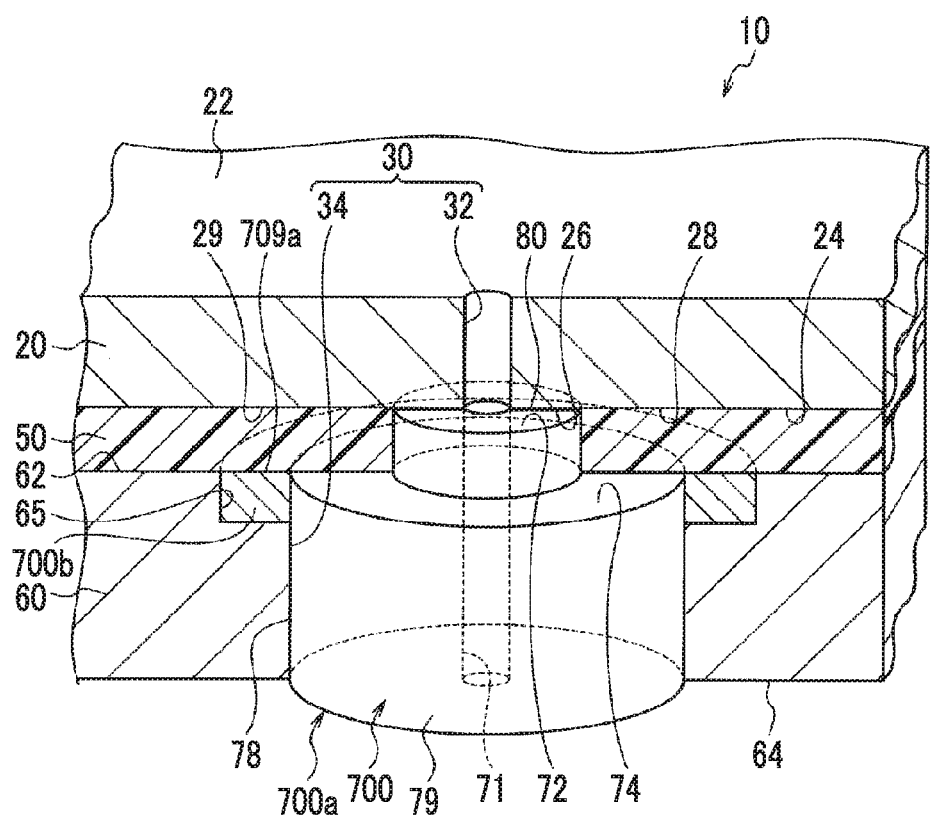
FIG. 2 is a sectional perspective view of the electrostatic chuck device shown in FIG. 1.
Figure 3:
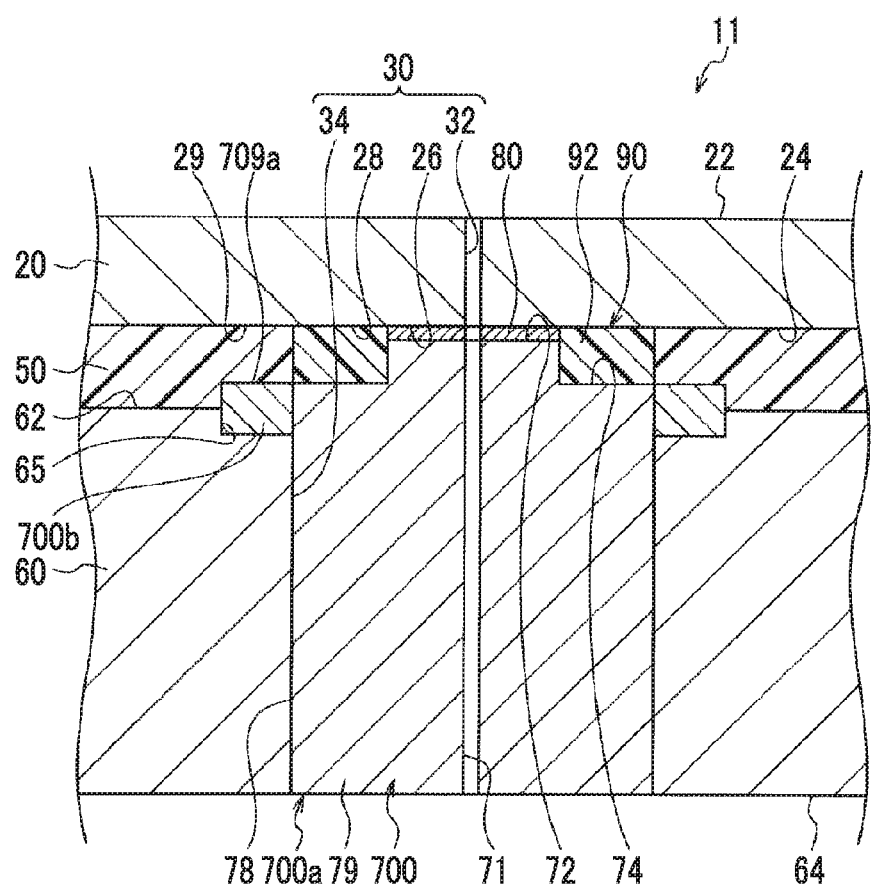
FIG. 3 is a partial cross-sectional view of an electrostatic chuck device according to a second embodiment of the present invention.

Electrostatic chuck devices 10 and 11 according to a first aspect of the present invention will be described with reference to FIGS. 1 to 3. Further, by combining known techniques, it is possible to easily obtain semiconductor manufacturing devices provided with the electrostatic chuck devices 10 and 11.

The same configurations are denoted by the same reference numerals, and description thereof is omitted.

First, with respect to the first aspect of the present invention, the electrostatic chuck device 10 according to a first embodiment of the present invention will be described with reference to FIGS. 1 and 2.

The electrostatic chuck device 10 is provided with an electrostatic chuck part 20, a cooling base part 60, an adhesion layer 50, a through-hole 30, and an insulator 700.

The electrostatic chuck part 20 is a plate-shaped member having one main surface 22 which is a surface on which a plate-shaped sample is placed, and the other main surface 24 which is a surface on the side opposite to one main surface 22.

The electrostatic chuck part 20 is formed of ceramic. Although not shown in the drawings, the electrostatic chuck part 20 has a placing plate, a supporting plate, an internal electrode for electrostatic attraction, and an insulating material layer.

One main surface 22 is a placing surface on which the plate-shaped sample is placed.

The other main surface 24 includes an electrostatic chuck part inner peripheral surface 26 and an electrostatic chuck part outer peripheral surface 28, both of which will be described later. As will be described later, a chuck part through-hole 32 which penetrates the electrostatic chuck part 20 is formed in the electrostatic chuck part 20 so as to be open in each of one main surface 22 and the other main surface 24. Both ends of the chuck part through-hole 32 are respectively open in one main surface 22 and the other main surface 24.

The electrostatic chuck part 20 has the electrostatic chuck part inner peripheral surface 26, the electrostatic chuck part outer peripheral surface 28, and an electrostatic chuck part outermost peripheral surface 29.

The electrostatic chuck part inner peripheral surface 26 surrounds an opening of the chuck part through-hole 32 on the cooling base part 60 side of the electrostatic chuck part 20.

The electrostatic chuck part outer peripheral surface 28 surrounds the electrostatic chuck part inner peripheral surface 26 on the cooling base part 60 side of the electrostatic chuck part 20.

The electrostatic chuck part outermost peripheral surface 29 surrounds the electrostatic chuck part outer peripheral surface 28 on the cooling base part 60 side of the electrostatic chuck part 20.

All the electrostatic chuck part inner peripheral surface 26, the electrostatic chuck part outer peripheral surface 28, and the electrostatic chuck part outermost peripheral surface 29 are parts of the other main surface 24.

The cooling base part 60 is a member for cooling the electrostatic chuck part 20. The cooling base part 60 is a thick disk-shaped member having an upper surface 62 and a lower surface 64. A base part through-hole 34 (described later) is formed in the cooling base part 60. The cooling base part 60 has a through-hole for cooling and a flow path for cooling which are not shown in the drawings. The flow path for cooling is formed in the through-hole for cooling such that a cooling medium such as water or a fluorine-based refrigerant circulates through the flow path for cooling.

The cooling medium having a predetermined temperature and flow rate flows through the flow path for cooling, whereby the temperature of the cooling base part 60 is adjusted, and consequently, the temperature of the electrostatic chuck part 20 is adjusted to a desired temperature. A material configuring the cooling base part 60 is preferably metal excellent in thermal conductivity, electric conductivity, and workability, or a compound material containing the metal, and is further preferably formed of aluminum or titanium.

The cooling base part 60 further has a cooling base recess portion 65 in the first embodiment and a second embodiment. The cooling base recess portion 65 is formed on the electrostatic chuck part 20 side of the cooling base part 60 such that the opening on the electrostatic chuck part 20 side of the base part through-hole 34 is widened.

The adhesion layer 50 is formed between the other main surface 24 of the electrostatic chuck part 20 and the upper surface 62 of the cooling base part 60 and bonds the electrostatic chuck part 20 and the cooling base part 60 together. In the first embodiment and the second embodiment, the adhesion layer 50 overrides an outer insulator 700b (described later) and extends to a gap between the electrostatic chuck part outer peripheral surface 28 and an insulator outer end face 74.

In the adhesion layer 50, an elastic material is used as a composition thereof, and therefore, the adhesion layer 50 acts to alleviate thermal stress due to a difference between the temperature displacement of the electrostatic chuck part 20 and the temperature displacement of the cooling base part 60 according to a temperature change.

The adhesion layer 50 may be formed of, for example, a cured body obtained by thermally curing a silicone-based resin composition, or acrylic resin, and a material with fillers such as ceramic added thereto may be used in order to improve properties such as thermal conductivity. If fillers are added to the adhesion layer 50, the heat transfer coefficient of the adhesion layer 50 changes.

The through-hole 30 has the chuck part through-hole 32 and the base part through-hole 34.

The chuck part through-hole 32 is a through-hole penetrating the electrostatic chuck part 20. Both ends of the chuck part through-hole 32 are respectively open in one main surface 22 and the other main surface 24.

The base part through-hole 34 is a through-hole penetrating the cooling base part 60. Both ends of the base part through-hole 34 are respectively open in the upper surface 62 and the lower surface 64. The base part through-hole 34 communicates with the chuck part through-hole 32. The base part through-hole 34 has a cylindrical side surface shape. The base part through-hole 34 has a larger diameter than the chuck part through-hole 32 such that the peripheral surface of the opening of the chuck part through-hole 32 in the other main surface 24 is exposed from the base part through-hole 34.

The insulator 700 has an inner insulator 700a, and the outer insulator 700b surrounding the inner insulator 700a. The inner insulator 700a has an insulator main body 79 having a columnar side surface shape, an outer peripheral side surface 78, an insulator through-hole 71, an insulator inner end face 72 surrounding the insulator through-hole 71, and an insulator outer end face 74 surrounding the insulator inner end face 72. The inner insulator 700a is formed of a material which is high in electrical insulating properties, weather resistance, mechanical strength, and the like.

The outer peripheral side surface 78 is the side surface of the insulator main body 79. The outer peripheral side surface 78 has the same shape as the columnar side surface shape of the outer peripheral side surface 78 such that the outer peripheral side surface 78 comes into close contact with the base part through-hole 34. The insulator 700 is provided in the base part through-hole 34 such that the outer peripheral side surface 78 comes into close contact with the base part through-hole 34.

The inner insulator 700a has the insulator inner end face 72 and the insulator outer end face 74. The insulator inner end face 72 is formed on the electrostatic chuck part 20 side of the insulator main body 79 such that the insulator inner end face 72 comes into contact with the electrostatic chuck part inner peripheral surface 26 or the adhesion layer 50 extends in a gap between the inner insulator 700a and the electrostatic chuck part 20 and such that the insulator inner end face 72 faces the electrostatic chuck part inner peripheral surface 26. The insulator outer end face 74 is formed on the electrostatic chuck part 20 side of the insulator main body 79 so as to face the electrostatic chuck part outer peripheral surface 28.

The outer insulator 700b has an upper surface 709a formed on the electrostatic chuck part 20 side of the insulator main body 79 so as to face the electrostatic chuck part outermost peripheral surface 29. The outer insulator 700b has a ring shape and surrounds the inner insulator 700a. The upper surface 709a of the outer insulator 700b is located at substantially the same position as the insulator outer end face 74. The side opposite to the electrostatic chuck part 20 of the outer insulator 700b is located in the cooling base recess portion 65.

The insulator through-hole 71 is a through-hole which extends in an axial direction of the column of the insulator main body 79 and has an opening on the electrostatic chuck part 20 side so as to communicate with the chuck part through-hole 32.

The insulator inner end face 72 is a ring-shaped end face which surrounds the insulator through-hole 71, out of the end faces on the electrostatic chuck part 20 side of the insulator main body 79.

The insulator outer end face 74 is a ring-shaped end face which surrounds the insulator inner end face 72.

The insulator outer end face 74 is spaced apart farther from the electrostatic chuck part 20 than the insulator inner end face 72 in the axial direction of the column of the insulator main body 79. That is, an end portion on the electrostatic chuck part 20 side of the insulator 700 has a protrusion shape in which the periphery of the insulator through-hole 71 is higher than the periphery thereof.

The electrostatic chuck part inner peripheral surface 26 and the insulator inner end face 72 face each other so as to come into contact with each other such that plasma infiltrating through the chuck part through-hole 32 does not erode the adhesion layer 50.

A gap to the extent that plasma infiltrating through the chuck part through-hole 32 does not erode the adhesion layer 50 may be present between the electrostatic chuck part inner peripheral surface 26 and the insulator inner end face 72, and an adhesion layer 80 may be provided between the electrostatic chuck part inner peripheral surface 26 and the insulator inner end face 72. The adhesion layer 80 may be the same as the adhesion layer 50 or may be the same as a plasma-resistant adhesive layer 90.

The electrostatic chuck part outer peripheral surface 28 and the insulator outer end face 74 formed on the electrostatic chuck part 20 side of the insulator main body 79 face each other with a predetermined gap therebetween.

According to the electrostatic chuck device 10, the insulator inner end face 72 and the electrostatic chuck part inner peripheral surface 26 are in contact with each other so as to prevent the infiltration of plasma entering through the through-hole 30. For this reason, the plasma infiltrating through the chuck part through-hole 32 is prevented from infiltrating at the narrow gap between the insulator inner end face 72 and the electrostatic chuck part inner peripheral surface 26.

Further, it is possible to increase a distance from an area between the electrostatic chuck part inner peripheral surface 26 and the insulator inner end face 72 to the upper surface 62 of the cooling base part 60, and therefore, it is difficult for the infiltrating plasma to reach the upper surface 62 of the cooling base part 60 through the narrow gap between the insulator inner end face 72 and the electrostatic chuck part inner peripheral surface 26, and thus it is possible to prevent dielectric breakdown.

Further, the gap between the insulator inner end face 72 and the electrostatic chuck part inner peripheral surface 26 is narrow, and therefore, it is possible to suppress deterioration of the adhesion layer 50 due to plasma infiltrating through the chuck part through-hole 32. Therefore, it is possible to more uniformly control the heat transfer coefficient between the electrostatic chuck part 20 and the cooling base part 60.

Further, the outer insulator 700b surrounding the outer side of the inner insulator 700a is provided, and therefore, it is possible to increase a creeping distance. Further, the distance of a range in which the insulator inner end face 72 and the electrostatic chuck part inner peripheral surface 26 face each other, in a direction (in the plane of FIG. 1, right-left and front-back directions) in which the other main surface 24 of the electrostatic chuck part 20 or the upper surface 62 of the cooling base part 60 extends from the chuck part through-hole 32, can be set separately from the distance of a range in which the electrostatic chuck part outermost peripheral surface 29 and the upper surface 709a of the insulator main body 79 face each other.

Next, with respect to a second aspect of the present invention, an electrostatic chuck device 11 according to the second embodiment of the present invention will be described with reference to FIG. 3.

The electrostatic chuck device 11 is the same as the electrostatic chuck device 10 except that the electrostatic chuck device 11 is further provided with the plasma-resistant adhesive layer 90.

The plasma-resistant adhesive layer 90 has a ring-shaped adhesive part 92. The ring-shaped adhesive part 92 is formed between the electrostatic chuck part outer peripheral surface 28 and the insulator outer end face 74 such that plasma infiltrating through the chuck part through-hole 32 does not erode the adhesion layer 50.

The plasma-resistant adhesive layer 90 is, for example, an acrylic or fluorine-based adhesive.

According to the electrostatic chuck device 11, the plasma-resistant adhesive layer 90 has the ring-shaped adhesive part 92, and therefore, the plasma-resistant adhesive layer 90 prevents the infiltration of plasma through the through-hole 30. Therefore, deterioration of the adhesion layer 50 can be further suppressed.

Hereinafter, electrostatic chuck devices 1 to 6 (third to eighth embodiments) according to the second aspect of the present invention will be described with reference to FIGS. 4 to 10. Further, by combining known techniques, it is possible to obtain semiconductor manufacturing devices provided with the electrostatic chuck devices 1 to 6.

Figure 4:
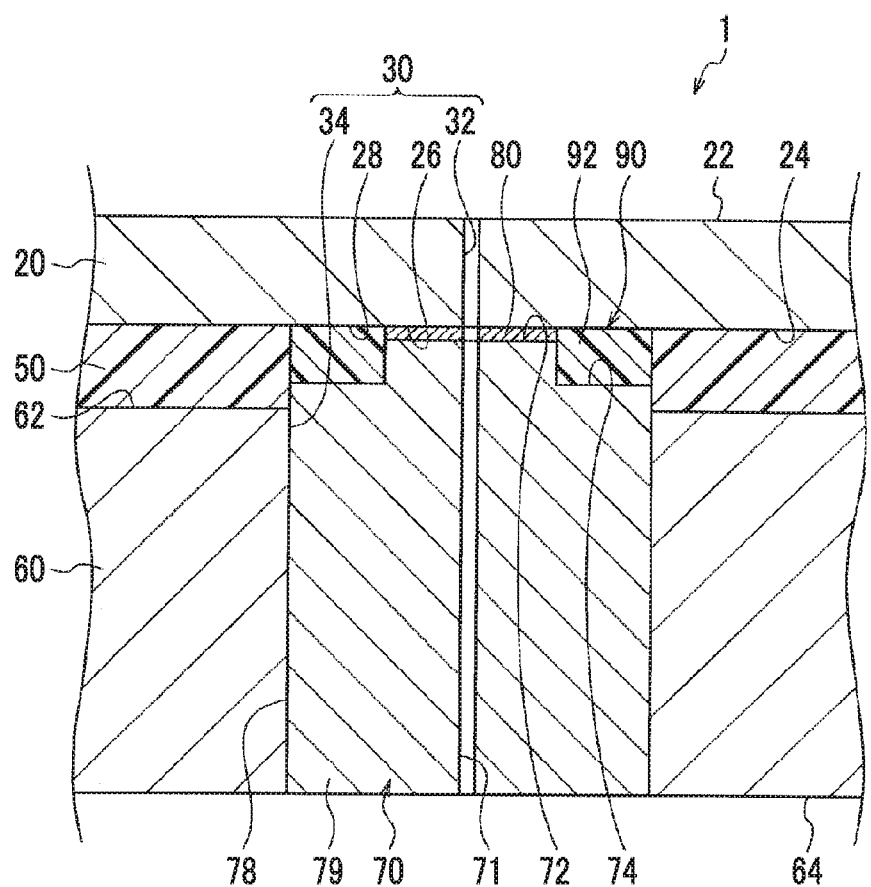
FIG. 4 is a partial cross-sectional view of an electrostatic chuck device according to a third embodiment of the present invention.
Figure 5:
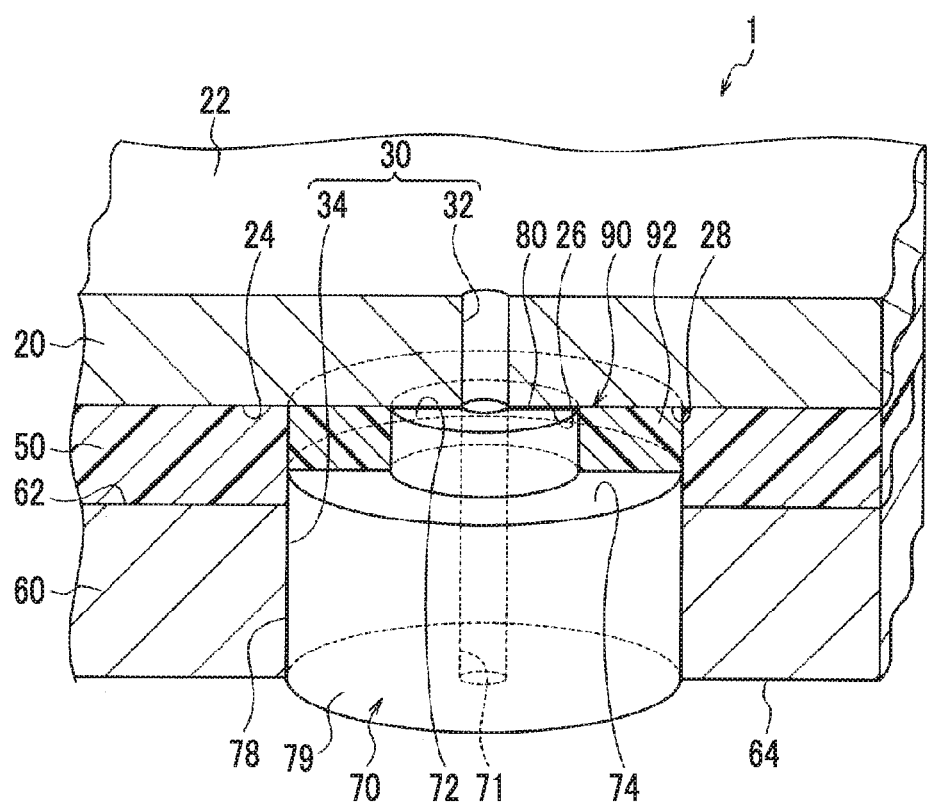
FIG. 5 is a sectional perspective view of the electrostatic chuck device shown in FIG. 4.

An electrostatic chuck device 1 according to a third embodiment of the present invention will be described with reference to FIGS. 4 and 5.

The electrostatic chuck device 1 is provided with the electrostatic chuck part 20, the cooling base part 60, the adhesion layer 50, the through-hole 30, an insulator 70, and the plasma-resistant adhesive layer 90.

The adhesion layer 50 is formed between the other main surface 24 of the electrostatic chuck part 20 and the upper surface 62 of the cooling base part 60 and bonds the electrostatic chuck part 20 and the cooling base part 60 together.

The base part through-hole 34 has a larger diameter than the chuck part through-hole 32 such that the electrostatic chuck part inner peripheral surface 26 and the electrostatic chuck part outer peripheral surface 28 are exposed from the base part through-hole 34.

The insulator 70 is the inner insulator 700a of the insulator 70 in the first and second embodiments and does not have the outer insulator 700b. Therefore, the insulator 70 in the third embodiment to the eighth embodiment is the same as the inner insulator 700a in the first and second embodiments.

The insulator inner end face 72 is a ring-shaped end face which surrounds the insulator through-hole 71, out of the end faces on the electrostatic chuck part 20 side of the insulator main body 79.

The insulator outer end face 74 is a ring-shaped end face which surrounds the insulator inner end face 72.

The insulator outer end face 74 is spaced apart farther from the electrostatic chuck part 20 than the insulator inner end face 72 in the axial direction of the column of the insulator main body 79. That is, an end portion on the electrostatic chuck part 20 side of the insulator 70 has a protrusion shape in which the periphery of the insulator through-hole 71 is higher than the periphery thereof.

The electrostatic chuck part inner peripheral surface 26 and the insulator inner end face 72 face each other so as to come into contact with each other such that plasma infiltrating through the chuck part through-hole 32 does not erode the adhesion layer 50.

A gap to the extent that plasma infiltrating through the chuck part through-hole 32 does not reach the adhesion layer 50 may be provided between the electrostatic chuck part inner peripheral surface 26 and the insulator inner end face 72, and the adhesion layer 80 may be provided between the electrostatic chuck part inner peripheral surface 26 and the insulator inner end face 72 such that plasma infiltrating through the chuck part through-hole 32 does not erode the adhesion layer 50. The adhesion layer 80 may be the same as the adhesion layer 50 or may be the same as the plasma-resistant adhesive layer 90.

The electrostatic chuck part outer peripheral surface 28 and the insulator outer end face 74 formed on the electrostatic chuck part 20 side of the insulator main body 79 face each other with a predetermined gap therebetween.

The plasma-resistant adhesive layer 90 has the ring-shaped adhesive part 92. The ring-shaped adhesive part 92 is formed between the electrostatic chuck part outer peripheral surface 28 and the insulator outer end face 74 such that plasma infiltrating through the chuck part through-hole 32 does not erode the adhesion layer 50.

The plasma-resistant adhesive layer 90 is, for example, an acrylic or fluorine-based adhesive.

According to the electrostatic chuck device 1, in order to prevent infiltration of plasma entering through the through-hole 30, particularly, the chuck part through-hole 32, the insulator inner end face 72 and the electrostatic chuck part inner peripheral surface 26 are in contact with each other, or the adhesion layer 80 is formed in a gap between the insulator inner end face 72 and the electrostatic chuck part inner peripheral surface 26, and the plasma-resistant adhesive layer 90 is formed between the electrostatic chuck part outer peripheral surface 28 and the insulator outer end face 74. For this reason, the plasma infiltrating through the through-hole 30 is first prevented from infiltrating at the narrow gap between the insulator inner end face 72 and the electrostatic chuck part inner peripheral surface 26 and subsequently prevented from infiltrating at the plasma-resistant adhesive layer 90 formed between the electrostatic chuck part outer peripheral surface 28 and the insulator outer end face 74. Accordingly, deterioration of the adhesion layer 50 due to plasma can be suppressed, and therefore, it is possible to prevent dielectric breakdown of the adhesion layer 50 and to more uniformly control the heat transfer coefficient between the electrostatic chuck part 20 and the cooling base part 60. Further, it is possible to prevent dielectric breakdown due to short-circuit between plasma and the cooling base part.

Figure 6:
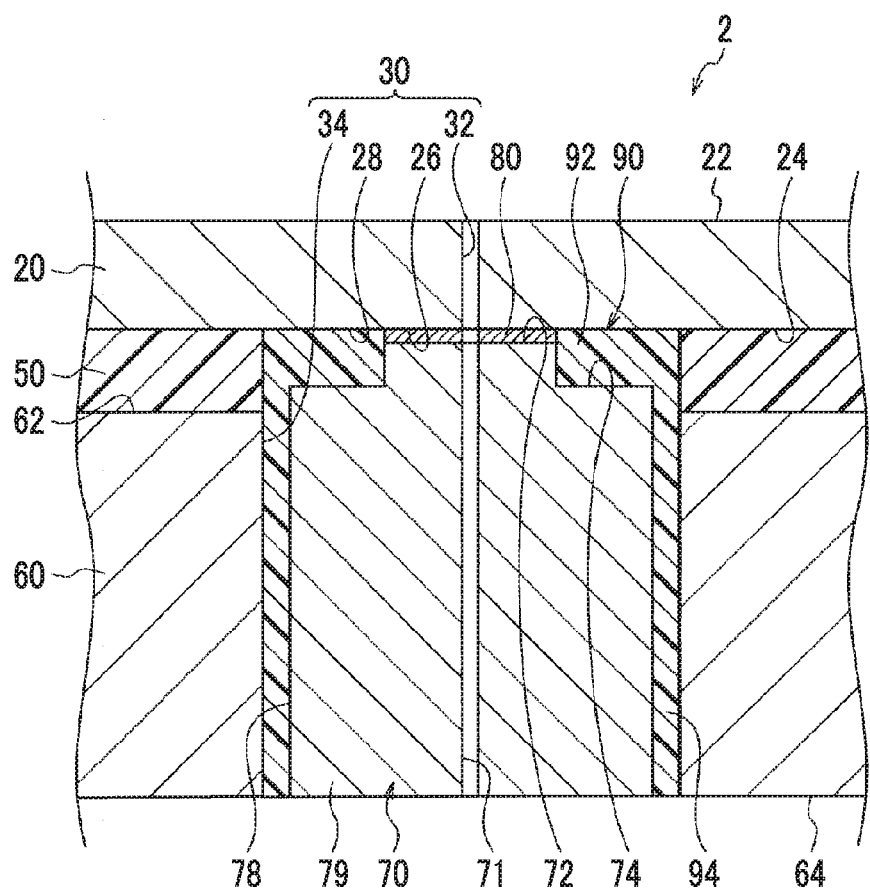
FIG. 6 is a partial cross-sectional view of an electrostatic chuck device according to a fourth embodiment of the present invention.

An electrostatic chuck device 2 according to a fourth embodiment of the present invention will be described with reference to FIG. 6.

The electrostatic chuck device 2 is the same as that of the electrostatic chuck device 1 except that the shape of the plasma-resistant adhesive layer 90 is different from that in the electrostatic chuck device 1 and the insulator 70 has the outer peripheral side surface 78 having a slightly smaller diameter than the base part through-hole 34 of the cooling base part 60.

The plasma-resistant adhesive layer 90 has the ring-shaped adhesive part 92 which is located between the electrostatic chuck part outer peripheral surface 28 and the insulator outer end face 74, and a tubular adhesive part 94 formed between the outer peripheral side surface 78 of the insulator 70 and the base part through-hole 34 of the cooling base part 60. That is, the plasma-resistant adhesive layer 90 extends from an area between the electrostatic chuck part outer peripheral surface 28 and the insulator outer end face 74 to an area between the outer peripheral side surface 78 of the insulator 70 and the base part through-hole 34 of the cooling base part 60.

According to the electrostatic chuck device 2, the plasma-resistant adhesive layer 90 has the tubular adhesive part 94, and therefore, a distance in which the plasma-resistant adhesive layer 90 prevents infiltration of plasma through the through-hole 30, particularly, the chuck part through-hole 32 becomes longer by the thickness of the tubular adhesive part 94. Therefore, deterioration of the adhesion layer 50 can be further suppressed.

Further, even if plasma (radicals) infiltrating into the insulator through-hole 71 tries to infiltrate from the lower surface of the insulator main body 79 toward the upper surface 62 through an area between the outer peripheral side surface 78 and the insulator main body 79, the tubular adhesive part 94 which is present between the outer peripheral side surface 78 of the insulator 70 and the base part through-hole 34 can prevent the infiltration, and therefore, it is possible to prevent dielectric breakdown due to short-circuit between plasma and the cooling base part.

Further, the tubular adhesive part 94 is present between the outer peripheral side surface 78 of the insulator 70 and the base part through-hole 34, and therefore, a dimensional allowance value between the outer peripheral side surface 78 of the insulator 70 and the base part through-hole 34 can be increased.

Figure 7:
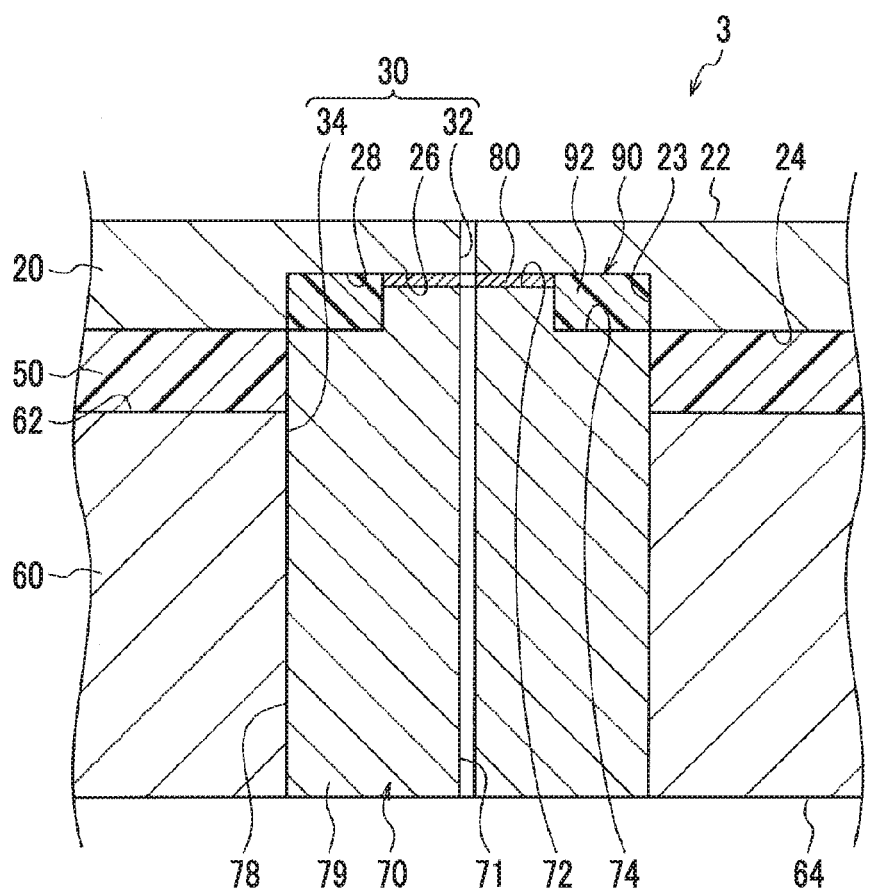
FIG. 7 is a partial cross-sectional view of an electrostatic chuck device according to a fifth embodiment of the present invention.

An electrostatic chuck device 3 according to a fifth embodiment of the present invention will be described with reference to FIG. 7.

The electrostatic chuck device 3 is the same as the electrostatic chuck device 1 except that an electrostatic chuck part recess portion 23 is formed in the electrostatic chuck part 20 on the cooling base part 60 side and the electrostatic chuck part inner peripheral surface 26 and the electrostatic chuck part outer peripheral surface 28 serve as the bottom surface of the electrostatic chuck part recess portion 23. The bottom surface of the electrostatic chuck part recess portion 23, that is, both the electrostatic chuck part inner peripheral surface 26 and the electrostatic chuck part outer peripheral surface 28 are located on the cooling base part 60 side of the electrostatic chuck part 20.

According to the electrostatic chuck device 3, the gap between the electrostatic chuck part inner peripheral surface 26 and the insulator inner end face 72, through which plasma from the through-hole 30, particularly, the chuck part through-hole 32 infiltrates, is on the bottom surface of the electrostatic chuck part recess portion 23, and thus the distance from the gap between the electrostatic chuck part inner peripheral surface 26 and the insulator inner end face 72 to the adhesion layer 50 becomes longer than that in the electrostatic chuck device 1. Therefore, deterioration of the adhesion layer 50 can be further suppressed.

Further, if the distance between the electrostatic chuck part outer peripheral surface 28 and the insulator outer end face 74 is short, the ring-shaped adhesive part 92 of the plasma-resistant adhesive layer 90 is formed in a hollow rectangular ring having a cross section surrounded by the electrostatic chuck part recess portion 23 and the insulator outer end face 74. For this reason, a portion on the insulator 70 side of the side surface of the electrostatic chuck part recess portion 23 and a portion on the electrostatic chuck part 20 side of the outer peripheral side surface 78 overlap so as to be in contact with each other, and a slight gap is formed in the overlapped portion. Then, the infiltration of plasma can be suppressed by the gap, and therefore, deterioration of the adhesion layer 50 can be further suppressed.

Figure 8:
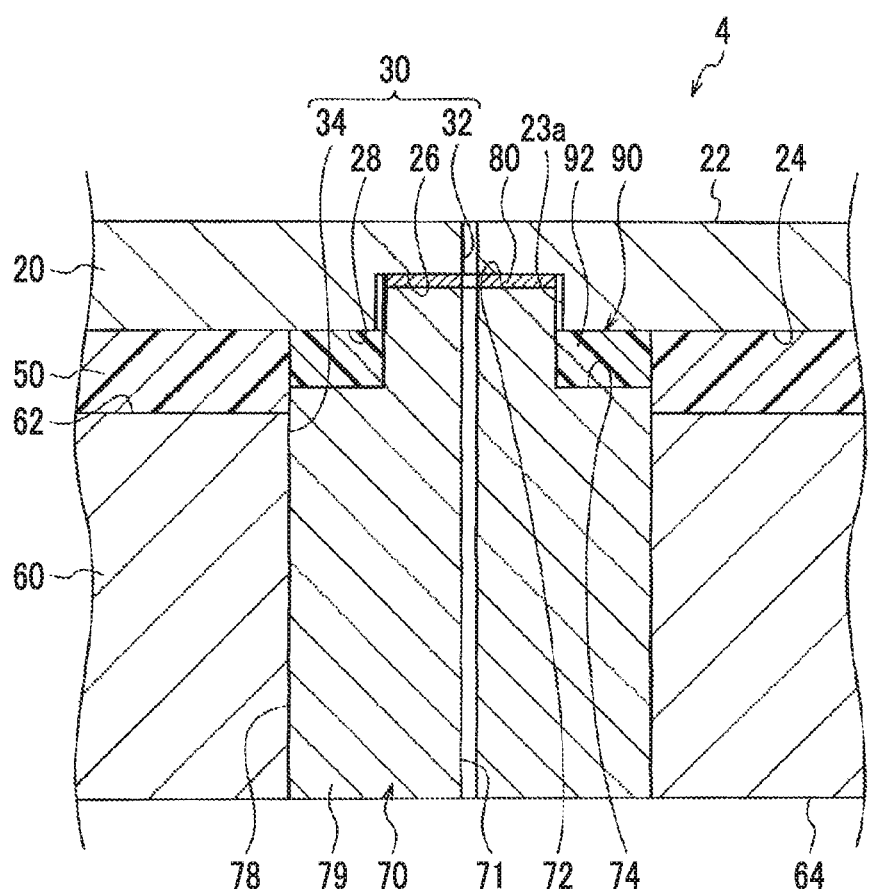
FIG. 8 is a partial cross-sectional view of an electrostatic chuck device according to a sixth embodiment of the present invention.

An electrostatic chuck device 4 according to a sixth embodiment of the present invention will be described with reference to FIG. 8.

The electrostatic chuck device 4 is the same as the electrostatic chuck device 1 except for the following points.

An electrostatic chuck part recess portion 23a is formed in the electrostatic chuck part 20 on the cooling base part 60 side. The electrostatic chuck part inner peripheral surface 26 serves as the bottom surface of the electrostatic chuck part recess portion 23a. The electrostatic chuck part outer peripheral surface 28 serves as the periphery of an opening of the electrostatic chuck part recess portion 23a. All the bottom surface of the electrostatic chuck part recess portion 23a, the electrostatic chuck part inner peripheral surface 26, and the electrostatic chuck part outer peripheral surface 28 are located on the cooling base part 60 side of the electrostatic chuck part 20.

According to the electrostatic chuck device 4, the gap between the electrostatic chuck part inner peripheral surface 26 and the insulator inner end face 72, through which plasma from the through-hole 30, particularly, the chuck part through-hole 32 infiltrates, is on the bottom surface of the electrostatic chuck part recess portion 23a, and thus the distance from the gap between the electrostatic chuck part inner peripheral surface 26 and the insulator inner end face 72 to the adhesion layer 50 becomes longer than that in the electrostatic chuck device 1. Therefore, deterioration of the adhesion layer 50 can be further suppressed.

Figure 9:
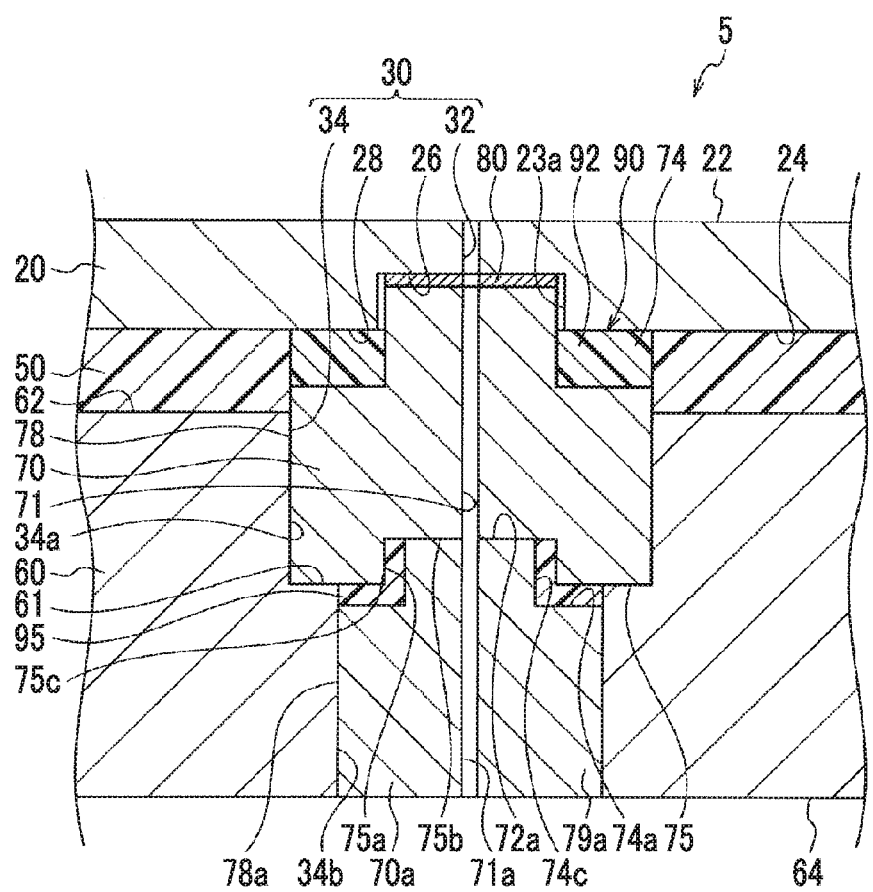
FIG. 9 is a partial cross-sectional view of an electrostatic chuck device according to a seventh embodiment of the present invention.

An electrostatic chuck device 5 according to a seventh embodiment of the present invention will be described with reference to FIG. 9.

The electrostatic chuck device 5 is the same as the electrostatic chuck device 1 or the electrostatic chuck device 4 except for the following points.

The cooling base part 60 has a cooling base recess portion 61 on the electrostatic chuck part 20 side.

The cooling base recess portion 61 is formed on the electrostatic chuck part 20 side of the cooling base part 60 so as to widen the opening on the electrostatic chuck part 20 side of the base part through-hole 34. The base part through-hole 34 is configured with a side surface 34a of the cooling base recess portion 61 and a lower base part through-hole 34b.

An insulator recess portion 75a is formed in an insulator end portion 75 on the side opposite to the electrostatic chuck part 20 of the insulator 70. An end face surrounding an opening of the insulator recess portion 75a, out of the end faces of the insulator end portion 75, serves as an insulator lower end face 75c.

The side opposite to the electrostatic chuck part 20 of the insulator through-hole 71 is open in a bottom surface 75b of the insulator recess portion 75a.

The insulator end portion 75 on the side opposite to the electrostatic chuck part 20 of the insulator 70 is located in the cooling base recess portion 61.

The electrostatic chuck device 5 is further provided with a lower insulator 70a and a lower plasma-resistant adhesive layer 95.

The lower insulator 70a is disposed on the side opposite to the electrostatic chuck part 20 of the insulator 70. Since the insulator 70 is located in the cooling base recess portion 61, the lower insulator 70a is disposed in the lower base part through-hole 34b.

The lower insulator 70a has a lower insulator main body 79a, a lower insulator inner end face 72a, and a lower insulator outer end face 74a.

The lower insulator main body 79a has a lower insulator through-hole 71a which communicates with the insulator through-hole 71 and surrounds the opening of the insulator through-hole 71.

The lower insulator inner end face 72a is formed on the insulator 70 side of the lower insulator main body 79a so as to come into contact with the bottom surface 75b of the insulator recess portion 75a.

The lower insulator outer end face 74a is formed on the electrostatic chuck part 20 side of the lower insulator main body 79a so as to face the insulator lower end face 75c. The lower insulator outer end face 74a is spaced apart farther from the insulator 70 than the lower insulator inner end face 72a in the axial direction of the column of the lower insulator main body 79a. That is, an end portion on the insulator 70 side of the lower insulator 70a has a protrusion shape in which the periphery of the lower insulator through-hole 71a is higher than the periphery thereof.

A protrusion portion side surface 74c is formed between the lower insulator inner end face 72a and the lower insulator outer end face 74a. The protrusion portion side surface 74c faces the side surface of the insulator recess portion 75a.

The lower plasma-resistant adhesive layer 95 is formed between the insulator 70 and the lower insulator 70a. Specifically, the lower plasma-resistant adhesive layer 95 is formed between the insulator lower end face 75c of the insulator end portion 75 and the lower insulator outer end face 74a. Further, the lower plasma-resistant adhesive layer 95 may extend from an area between the insulator lower end face 75c of the insulator end portion 75 and the lower insulator outer end face 74a to an area between the side surface of the insulator recess portion 75a and the protrusion portion side surface 74c of the lower insulator 70a.

According to the electrostatic chuck device 5, the electrostatic chuck device 5 is provided with the insulator 70 and the lower insulator 70a, and therefore, the electrostatic chuck device 5 can be easily assembled merely by bonding the insulator 70 to the electrostatic chuck part 20, subsequently, bonding the cooling base part 60 to the electrostatic chuck part 20 such that the insulator 70 is fitted in the cooling base recess portion 61, and thereafter, putting the lower insulator 70a having the lower plasma-resistant adhesive layer 95 formed thereon in the lower base part through-hole 34b.

An electrostatic chuck device 6 according to an eighth embodiment of the present invention will be described with reference to FIG. 10.

The electrostatic chuck device 6 is the same as the electrostatic chuck devices 1 to 3 except for the following points.

The insulator 70 has an inner insulator 70b having an insulator through-hole 71b formed therein, and an outer insulator 70c surrounding the inner insulator 70b. The insulator inner end face 72 is formed by an end face 72b on the electrostatic chuck part 20 side of the inner insulator 70b, and an end face 74b on the electrostatic chuck part 20 side of the outer insulator 70c.

The plasma-resistant adhesive layer 90 has the ring-shaped adhesive part 92 and a cylindrical side surface-shaped adhesion part 96. The cylindrical side surface-shaped adhesion part 96 is formed in a cylindrical side surface-shaped space between a side surface 78b of the inner insulator 70b and an inner side surface 79b of the outer insulator 70c and extends to the ring-shaped adhesive part 92 via the gap between the end face 74b on the electrostatic chuck part 20 side of the outer insulator 70c and the other main surface 24. That is, the plasma-resistant adhesive layer 90 extends from an area between the electrostatic chuck part outer peripheral surface 28 and the insulator outer end face 74 to an area between the inner insulator 70b and the outer insulator 70c via the gap between the end face 74b of the outer insulator 70c and the other main surface 24.

According to the electrostatic chuck device 6, the plasma-resistant adhesive layer 90 extends from the ring-shaped adhesive part 92 to the end face 74b on the electrostatic chuck part 20 side of the outer insulator 70c, which is further on the chuck part through-hole 32 side than the ring-shaped adhesive part 92. For this reason, plasma infiltrating through the chuck part through-hole 32 becomes longer by the distance of the plasma-resistant adhesive layer 90 extending on the end face 74b, and therefore, deterioration of the adhesion layer 50 can be further suppressed.

Further, even if plasma (radicals) entering the insulator through-hole 71b tries to infiltrate from the lower surface 64 of the cooling base part 60 into an area between the side surface 78b of the inner insulator 70b and the inner side surface 79b of the outer insulator 70c, since the cylindrical side surface-shaped adhesion part 96 is present between the side surface 78b of the inner insulator 70b and the inner side surface 79b of the outer insulator 70c, it is possible to prevent the infiltration, and thus it is possible to prevent dielectric breakdown due to short-circuit between plasma and the cooling base part.

REFERENCE SIGNS LIST 1 to 6, 10, 11: electrostatic chuck device
20: electrostatic chuck part
22: one main surface of electrostatic chuck part
23, 23a: electrostatic chuck part recess portion
24: the other main surface of electrostatic chuck part
26: electrostatic chuck part inner peripheral surface
28: electrostatic chuck part outer peripheral surface
29: electrostatic chuck part outermost peripheral surface
30: through-hole
32: chuck part through-hole
34: base part through-hole
34a: side surface of cooling base recess portion
34b: lower base part through-hole
50: adhesion layer
60: cooling base part
61: cooling base recess portion
62: upper surface of cooling base part
64: lower surface of cooling base part
65: cooling base recess portion
70, 700: insulator
700a: inner insulator
700b: outer insulator
70a: lower insulator
70b: inner insulator
70c: outer insulator
71: insulator through-hole
71a: lower insulator through-hole
71b: insulator through-hole
72: insulator inner end face
72a: lower insulator inner end face
72b: end face of insulator inner end face (a part of insulator inner end face)
74: insulator outer end face
74a: lower insulator outer end face 74b: end face of outer insulator (a part of insulator inner end face)
74c: protrusion portion side surface
75: insulator end portion
75a: insulator recess portion
75b: bottom surface of insulator recess portion
75c: insulator lower end face
78: outer peripheral side surface of insulator
78b: side surface of inner insulator
79: insulator main body
79a: lower insulator main body
79b: inner side surface of outer insulator
80: adhesion layer
90: plasma-resistant adhesive layer
92: ring-shaped adhesive part
94: tubular adhesive part
95: lower plasma-resistant adhesive layer
96: cylindrical side surface-shaped adhesion part

The invention claimed is:

1. An electrostatic chuck device comprising:
an electrostatic chuck part having a placing surface on which a plate-shaped sample is plated;
a cooling base part which cools the electrostatic chuck part;
an adhesion layer formed between the electrostatic chuck part and the cooling base part so as to bond the electrostatic chuck part and the cooling base part together;
a through-hole having a chuck part through-hole penetrating the electrostatic chuck part, and a base part through-hole penetrating the cooling base part so as to communicate with the chuck part through-hole and having a larger diameter than the chuck part through-hole; and
an insulator provided in the base part through-hole,
wherein the electrostatic chuck part has an electrostatic chuck part inner peripheral surface surrounding an opening of the chuck part through-hole on the cooling base part side of the electrostatic chuck part, and an electrostatic chuck part outer peripheral surface surrounding the electrostatic chuck part inner peripheral surface on the cooling base part side of the electrostatic chuck part,
a cooling base recess portion is formed on the electrostatic chuck part side of the base part through-hole of the cooling base part,
the insulator has an inner insulator in which an insulator through-hole having an opening on the electrostatic chuck part side is formed, and an outer insulator surrounding the inner insulator,
in order prevent infiltration of plasma entering through the through-hole, the inner insulator and the electrostatic chuck part inner peripheral surface are in contact with each other, or the adhesion layer extends in a gap between the inner insulator and the electrostatic chuck part inner peripheral surface, and the insulator has an insulator inner end face formed on the electrostatic chuck part side of the insulator, and an insulator outer end face formed on the electrostatic chuck part side of the insulator so as to face the electrostatic chuck part outer peripheral surface, and
the side opposite to the electrostatic chuck part of the outer insulator is located in the cooling base recess portion.

2. The electrostatic chuck device according to claim 1, further comprising: a plasma-resistant adhesive layer disposed between the electrostatic chuck part outer peripheral surface and the insulator outer end face.

3. An electrostatic chuck device comprising:
an electrostatic chuck part having a placing surface on which a plate-shaped sample is plated;
a cooling base part which cools the electrostatic chuck part;
an adhesion layer formed between the electrostatic chuck part and the cooling base part so as to bond the electrostatic chuck part and the cooling base part together;
a through-hole having a chuck part through-hole penetrating the electrostatic chuck part, and a base part through-hole penetrating the cooling base part so as to communicate with the chuck part through-hole and having a larger diameter than the chuck part through-hole;
an insulator provided in the base part through-hole; and
a plasma-resistant adhesive layer disposed between the insulator and the electrostatic chuck part,
wherein the electrostatic chuck part has an electrostatic chuck part inner peripheral surface surrounding an opening of the chuck part through-hole on the cooling base part side of the electrostatic chuck part, and an electrostatic chuck part outer peripheral surface surrounding the electrostatic chuck part inner peripheral surface on the cooling base part side of the electrostatic chuck part,
the insulator has an insulator main body in which an insulator through-hole having an opening on the electrostatic chuck part side is formed, an insulator inner end face formed on the electrostatic chuck part side of the insulator main body, and an insulator outer end face formed on the electrostatic chuck part side of the insulator main body so as to face the electrostatic chuck part outer peripheral surface,
in order to prevent infiltration of plasma entering through the through-hole, the insulator inner end face and the electrostatic chuck part inner peripheral surface are in contact with each other, or the adhesion layer or the plasma-resistant adhesive layer extends in a gap between the insulator inner end face and the electrostatic chuck part inner peripheral surface, and
the plasma-resistant adhesive layer is formed between the electrostatic chuck part outer peripheral surface and the insulator outer end face.

4. The electrostatic chuck device according to claim 3, wherein the plasma-resistant adhesive layer extends from an area between the electrostatic chuck part outer peripheral surface and the insulator outer end face to an area between an outer peripheral side surface of the insulator and the cooling base part.

5. The electrostatic chuck device according to claim 3, wherein an electrostatic chuck part recess portion is formed in the electrostatic chuck part on the cooling base part side, and
the electrostatic chuck part inner peripheral surface and the electrostatic chuck part outer peripheral surface serve as a bottom surface of the electrostatic chuck part recess portion.

6. The electrostatic chuck device according to claim 3, wherein an electrostatic chuck part recess portion is formed in the electrostatic chuck part on the cooling base part side,
the electrostatic chuck part inner peripheral surface serves as a bottom surface of the electrostatic chuck part recess portion, and
the electrostatic chuck part outer peripheral surface serves as a periphery of an opening of the electrostatic chuck part recess portion.

7. The electrostatic chuck device according to claim 3, wherein the cooling base part has a cooling base recess portion on the electrostatic chuck part side,
- an insulator recess portion is formed in an insulator end portion on the side opposite to the electrostatic chuck part of the insulator,
- the side opposite to the electrostatic chuck part of the insulator is located in the cooling base recess portion,
- the electrostatic chuck device further comprises
- a lower insulator disposed on the side opposite to the electrostatic chuck part of the insulator, and
- a lower plasma-resistant adhesive layer formed between the insulator and the lower insulator,
- wherein the lower insulator has a lower insulator main body having a lower insulator through-hole which communicates with the insulator through-hole and surrounds an opening of the insulator through-hole, a lower insulator inner end face formed on the electrostatic chuck part side of the lower insulator main body so as to come into contact with a bottom surface of the insulator recess portion, and a lower insulator outer end face formed on the electrostatic chuck part side of the lower insulator main body so as to face an end face of the insulator end portion, and
- the lower plasma-resistant adhesive layer is formed between the end face of the insulator end portion and the lower insulator outer end face.

8. The electrostatic chuck device according to claim 3, wherein the insulator has an inner insulator having the insulator through-hole formed therein, and an outer insulator which surrounds the inner insulator,
- the insulator inner end face is formed by an end face on the electrostatic chuck part side of the inner insulator, and an end face on the electrostatic chuck part side of the outer insulator, and
- the plasma-resistant adhesive layer extends from an area between the electrostatic chuck part outer peripheral surface and the insulator outer end face to an area between the inner insulator and the outer insulator via the end face on the electrostatic chuck part side of the outer insulator.

9. A semiconductor manufacturing device comprising: the electrostatic chuck device according to claim 1.

10. A semiconductor manufacturing device comprising: the electrostatic chuck device according to claim 3.

* * * * *

UNITED STATES PATENT AND TRADEMARK OFFICE
CERTIFICATE OF CORRECTION

| | | |
|---|---|---|
| PATENT NO. | : 10,475,688 B2 | Page 1 of 1 |
| APPLICATION NO. | : 15/550205 | |
| DATED | : November 12, 2019 | |
| INVENTOR(S) | : K. Ishimura et al. | |

It is certified that error appears in the above-identified patent and that said Letters Patent is hereby corrected as shown below:

In the Claims

At Column 15, Line 50 (Claim 1, Line 31), please change "order prevent" to -- order to prevent --.

Signed and Sealed this
Seventh Day of July, 2020

Andrei Iancu
*Director of the United States Patent and Trademark Office*